United States Patent [19]

Horstman

[11] Patent Number: 4,985,628
[45] Date of Patent: Jan. 15, 1991

[54] INSPECTION APPARATUS INCORPORATING DIGITAL ELECTRON DETECTION

[75] Inventor: Robert E. Horstman, Eindhoven, Netherlands

[73] Assignee: U.S. Philips Corporation, New York, N.Y.

[21] Appl. No.: 277,572

[22] Filed: Nov. 29, 1988

[30] Foreign Application Priority Data

Dec. 1, 1987 [NL] Netherlands ............... 8702874

[51] Int. Cl.[5] ................................ G01N 23/00
[52] U.S. Cl. ............................ 250/310; 250/306; 250/311; 250/492.22
[58] Field of Search ............... 250/494.22, 311, 308, 250/252.1, 306, 310

[56] References Cited

U.S. PATENT DOCUMENTS

| | | | |
|---|---|---|---|
| 4,199,688 | 4/1980 | Ozasa | 250/310 |
| 4,301,366 | 11/1981 | Bertin et al. | 250/308 |
| 4,309,606 | 1/1982 | Björkman et al. | 250/252.1 |
| 4,322,626 | 3/1982 | Kawashima | 250/492.22 |
| 4,788,426 | 11/1988 | Kuehnle | 250/311 |
| 4,804,840 | 2/1989 | Ichihashi | 250/310 |
| 4,818,873 | 4/1989 | Herriot | 250/310 |
| 4,831,328 | 5/1989 | Brust | 250/310 |
| 4,870,344 | 9/1989 | Stille | 250/310 |

*Primary Examiner*—Jack I. Berman
*Assistant Examiner*—Kiet T. Nguyen
*Attorney, Agent, or Firm*—Bernard Franzblau

[57] ABSTRACT

An inspection apparatus which incorporates a digital electron detection device. In this apparatus, counting devices are used for the measurement of electrons emanating from an object after interaction with an incident radiation beam. Using these counters, detection is also possible even when the electron pulses have a small current content. By the addition of a DAC and possibly a sample-and-hold circuit, spectometric measurements are possible so that absolute potential values of a measuring point can be determined. For measurement of comparatively large currents, digital feedback can be used. Multi-sampling make possible much faster measurements.

15 Claims, 1 Drawing Sheet

INSPECTION APPARATUS INCORPORATING DIGITAL ELECTRON DETECTION

BACKGROUND OF THE INVENTION

This invention relates to a beam inspection apparatus, comprising a radiation source, a beam control system and a measuring space for positioning an object to be examined, and also comprising a detection device for the detection of electrons emerging from the object due to interaction between the beam and the object.

An inspection apparatus of this kind in the form of an electron beam apparatus for the inspection of chips is known from EP-A-196 958, and in the form of a scanning electron microscope from U.S. Pat. No. 4,438,332.

In the known apparatus an electron current originating from a measuring point, for example, a metal track on a chip, is measured. When this point is exposed to an electron beam, mainly secondary electrons emerge and, because the secondary emission coefficient is approximately 1 in appropriate circumstances which are assumed to exist here and hereinafter, the current intensity in the return beam is approximately equal to the current intensity of the primary beam. In the case of exposure to a light beam or more generally a photon beam, for example, an UV laser, mainly photoelectrons emerge. For the measurement of secondary electrons as well as photoelectrons, use is made of, for example, a luminescent element to which a photomultiplier tube is optically coupled. The persistence in the luminescent material and the spread in flight time for the low-energetic secondary electrons and photoelectrons make it desirable or even necessary to measure in a pulsed manner. To this end, known apparatus utilize a beam interruptor. Using a so-called boxcar circuit, the signal-to-noise ratio in the signal is improved by integration. The measurement by means of a boxcar circuit is described in detail in EP-A-196 958.

Because the dimensions of the elements to be inspected, for example, tracks in a chip, become increasingly smaller and at present already are in the order of magnitude of 0.5 $\mu$m, measurements must utilize an electron spot or photon spot having a comparatively small cross-section in order to ensure adequate resolution. When an electron spot having a cross-section of, for example, 0.1 $\mu$m is used, an electron beam current of at the most approximately 1 nA occurs for customary beam parameters and a secondary emission coefficient of approximately 1. When measurements are performed with a pulse duration of, for example, at the most approximately 0.5 ns, per pulse a charge corresponding to the charge of only a few electrons must be measured. In the case of exposure to a photon beam similar restrictions exist. Inter alia, because of a limited efficiency of the detector due to losses incurred in the interception of the electrons, it becomes increasingly more difficult to measure the secondary electron current for shorter pulses and/or smaller currents (spot diameter). In such cases the signal will readily become lost in the noise. Because the chips are increasingly more complex, an increasing number of measurements must be performed thereon for reliable inspection. Using a boxcar circuit, each time only one sample can be formed after each trigger. The use of a plurality of parallel connected boxcar circuits makes the inspection apparatus extremely complex.

SUMMARY OF THE INVENTION

It is an object of the invention to mitigate the described drawbacks. To achieve this, a beam inspection apparatus of the kind set forth in accordance with the invention is characterized in that the detection device comprises electronic counting devices.

Because, in an apparatus in accordance with the invention, for example, electrons can be individually counted and hence noise contributions to the measuring signals can be substantially reduced, accurate and fast measurement is possible without the signal being lost in noise, even in the case of a low signal intensity.

The fixed trigger frequency required for an integrating measuring method, such as a boxcar, can also be dispensed with because no information is lost in a counter. By using multi-sampling, which can be readily performed in the electronics in accordance with the invention, many samples can be taken after each trigger. For small current pulses electron counting can be used, while for higher current intensities use can be made of analog-digital feedback.

In a preferred embodiment in accordance with the invention, the radiation source is formed by an electron source and notably the object to be measured is an integrated semiconductor element (chip). The chip is arranged so as to be activatable in the measuring space.

In a further preferred embodiment, the apparatus comprises a beam interruptor for pulsed measurement, utilizing a pulse frequency offering optimum information from the electron pulses originating from the chip.

In a preferred embodiment, an apparatus which is suitable for the measurement of signals originating from a plurality of measurements after each trigger signal includes a fast memory in which measuring data can be temporarily stored.

In a further preferred embodiment, the detection device comprises an electronic delay device and, for example, a sample-and-hold device.

For analog measurement by means of counting devices in the detection method, a signal from, for example, a photomultiplier is applied, via an integrating RC circuit, to a differential amplifier which compares the signal with the output of a DAC. The output of the DAC is initially adjusted to, for example, half the maximum photomultiplier signal. After a given delay subsequent to the supply of a trigger pulse, a control pulse is applied to the beam interruptor. The output signal of the photomultiplier is integrated over, for example, 100 ns, so that the discrete counting nature of the individual electron count is spread. A sample and hold circuit takes up a signal, for example, after 110 ns. When this signal is lower than the output of the digital-to-analog converter, a counter which controls the DAC is decremented by one unit; otherwise, it is incremented by one unit. After, for example, some hundreds of trigger pulses, the DAC output thus becomes equal to the mean photomultiplier output voltage. In the case of a signal containing substantial noise, it is more attractive to couple the DAC to higher bits of the counter which then actually acts as a noise suppressor because discrimination then takes place only after several rectified signals. This method of measurement can also be used for multi-sampling. The counter is then loaded or unloaded from a memory to be addressed.

A further embodiment comprises means for energy-dependent detection of the electrons emerging from the object, so that absolute voltages or the voltage variation at a measuring point can be measured. Notably a delay grid is then arranged between the chip and the detector. This grid can be adjusted to a variable voltage via a DAC. Using a digital feedback loop to the delay grid, a photomultiplier output signal can be maintained at a constant value, thus enabling spectometric measurement. The potential of the grid follows the signal so that the voltage of a selected measuring point can be measured and thereby known. be measured.

A further preferred embodiment is suitable for the individual counting of electrons to be measured. Any rise beyond a defined threshold voltage can then be stored in a counter. The counter is enabled preferably only when relevant information can be expected, i.e. during a measuring period after a delay subsequent to a pulse admitted to the apparatus via a beam interruptor.

For multi-sampling, after each sample the counter contents are stored in a fast memory until a next trigger signal appears and are replaced by the contents of the next memory position before the next sample is formed. In a second counter all trigger signals are counted and on the basis thereof a control device is informed about the termination of the measurement.

DESCRIPTION OF THE PREFERRED EMBODIMENTS

Figure 1:
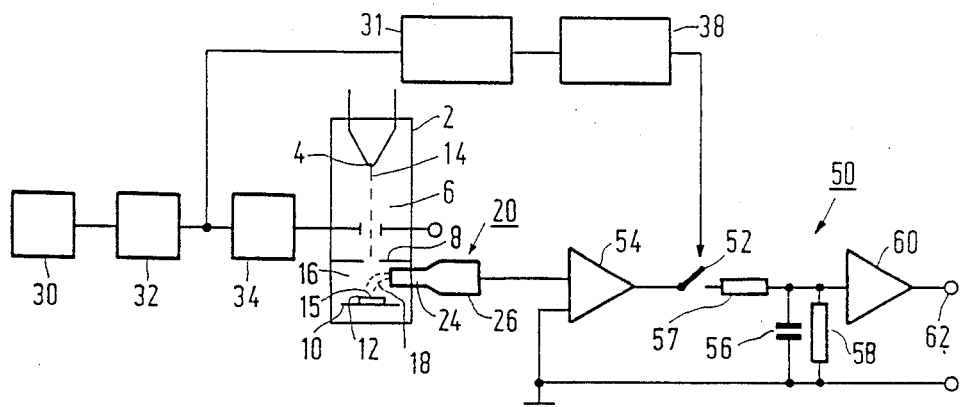
FIG. 1 shows a block diagram of an apparatus comprising a known detection device with a boxcar.

The block diagram of FIG. 1 shows the following components of a known apparatus: an electron-optical column 2, of which only an electron source 4, a beam interruption device 6, a diaphragm 8 and an object carrier 10 are shown. On the object carrier 10 there is arranged an object 12 to be examined, being an integrated semiconductor element or chip in the present case. An electron beam 14 emanating from the electron source 4 passes the beam interruptor 6 and enters, if the beam interruptor is inactive, a measuring space 16 via the diaphragm 8. The beam is incident on the object 12, thus causing the emergence of inter alia secondary electrons therefrom. Secondary electrons 18 can be detected by a secondary electron detector (SED) 20. Such an SED comprises a luminescent element 22 which is preferably arranged in the measuring space and which is connected, via an optical conductor 24, which may also constitute, for example, a wall portion of the column, to a photomultiplier tube 26. For suitable detection it is desirable that the luminescent material efficiently convert electrons into luminscent light and that it exhibit a comparatively short persistence, and that the photomultiplier exhibits fast response and little noise. Using a trigger pulse originating from a trigger clock 30, a pulse generator 34 is activated via a first delay 32. The pulse generator applies, for example, a voltage pulse to the beam interruptor 6 which is in this case constructed as a beam deflection device so that upon activation the electron beam is transmitted by the diaphragm 8. During a period of time which corresponds to a pulse width $\Delta T$, the non-deflected beam thus passing through the diaphragm 8 can enter the measuring space 16. Via a second delay 36, the same trigger pulse activates a gate pulse generator 38 which controls a switch 52 of a boxcar 50.

As has already been stated, the measurement of fast variations is limited by the inertia of the phosphor (customary phosphors exhibit a persistence of, for example, 60 ns) and by the spread in flight times of the secondary electrons which have to be "attracted" to the detector input from the chip surface. In order to enable fast measurement, a measuring point is exposed for a brief period $\Delta T$ at a fixed instant after a trigger pulse. The photomultiplier signal, having a duration of approximately 60 ns due to the persistence, then originates from the exposure pulse of, for example, 0.3 ns. The signal is small due to the low incident energy, and has only a short duration, for example, 60 ns, and is contained in the noise. Using the boxcar 50, in principle consisting of an amplifier 54, an integration capacitance 56 and a resistance 57, a leakage resistance 58 and an output amplifier 60, the time interval of interest is selected by activation of the switch 52 via the gate 38. The signal is stored in the integration capacitor 56. After a number of triggered measurements, the noise is thus averaged out. A potential occurring on an output terminal 62 of the amplifier 60 is proportional to the current intensity of the secondary electrons and is a measure of the potential of the measuring point during a time interval $\Delta T$ at a given instant t after the trigger.

Figure 2:
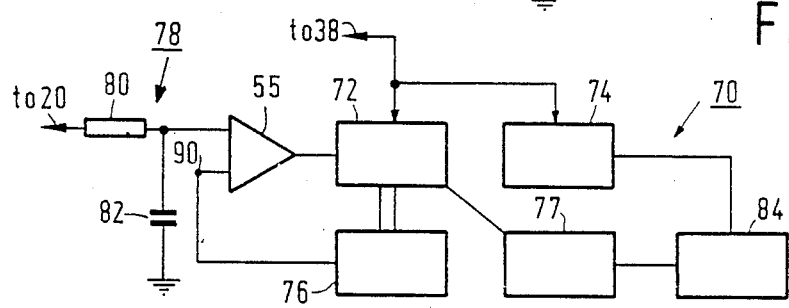
FIG. 2 shows a block diagram of an apparatus in accordance with the invention, comprising a counting device.

FIG. 2 shows an apparatus in which the boxcar 50 is replaced in accordance with the invention by a detection device 70 comprising counters 72 and 74, a DAC 76 and a memory 77 and in which an RC integrator 78, comprising a resistor 80 and a capacitor 82, and a computer 84 are connected between the detector 20 and the differential amplifier 54. Further elements of the apparatus in principle correspond to the elements shown in FIG. 1 and are denoted by corresponding references. The output of the DAC 76, connected to a first counter 72, is connected to an input of a difference detector 55.

The averaging out of noise which is performed by means of a boxcar in the known apparatus is now realized by the repeated comparison of a photomultiplier output signal with an output signal of the DAC 76. When the comparison result is negative, the DAC output potential is decreased by one unit; in the other case it is increased by one unit. After, for example, some hundreds of triggers, the mean DAC output voltage will be equal to the output voltage of the photomultiplier. The DAC voltage is then proportional to the contents of the counter 72. After each trigger, the counter 72 receives a pulse. Whether this pulse is added or subtracted is determined by the result of the comparison of the photomultiplier signal and the DAC signal at the instant at which the ascending edge of the clock pulse arrives from the delay 36. If the operation of the difference amplifier 55 is not fast enough, a sample-and-hold circuit can be inserted between the detector and the differential amplifier 55. The counter 74 counts the number of triggers and informs a computer 84 that a measurement has been completed.

For the averaging out of noise, the DAC is connected to higher-order bits. Using a three bit comparison of the signals should then be eight successive times higher or lower in order to cause adaptation of the DAC voltage.

The measuring result obtained thus far is essentially equal to the result obtained by means of a boxcar device. The trigger frequency, however, need not be constant for the measuring method in accordance with the invention. After expiration of the measuring period of 60 ns, a next excitation pulse can be given and the photo-multiplier output can again be compared with the DAC output. It must be ensured, however, that the counter 72 is loaded with a voltage value associated with the next measurement, which value can be fetched from a memory for this purpose. The counter contents of the preceding measurement are stored in the memory until it is required for a next trigger. Thus, using a sweep of 10 μs, 100 measurements of 100 ns each can be performed and a time saving by a factor of 100 is realized.

Using an RC integration circuit formed by the resistor 80 and the capacitor 82, the discrete nature of individual electron interception is spread.

Figure 3:
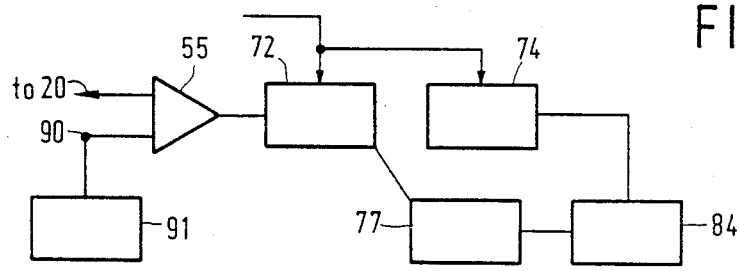
FIG. 3 shows a block diagram of an apparatus which is suitable for the individual counting of electrons.

In the block diagram of FIG. 3, corresponding elements are again denoted by corresponding references. For the counting of individual electrons, a source of threshold voltage a1 applies a threshold voltage $V_t$ to an input 90 of a difference detector 55 and in a counter 72 each exceeding of the threshold, corresponding to a single electron, is counted. Via a gate circuit 38, the counter 72 is enabled only when relevant information is to be expected. Contrary to the boxcar method, this is not done to suppress noise, because noise is not registered anyway, but to reduce the undue counting of any electrons unduly transmitted by the beam interruptor. In practice this takes place during approximately 100 ns, starting approximately 100 ns after a beam pulse. In a counter 74 all trigger pulses are counted again. A memory 77 is included in order to enable multi-sampling. The contents of the counter 72 can be temporarily stored in the memory until the next trigger pulse appears. In addition to the counting of the number of trigger pulses, the counter 74 also informs a computer 84, after an adjustable number of triggers, for example $10^4$, that the relevant measuring process has been completed.

Figure 4:
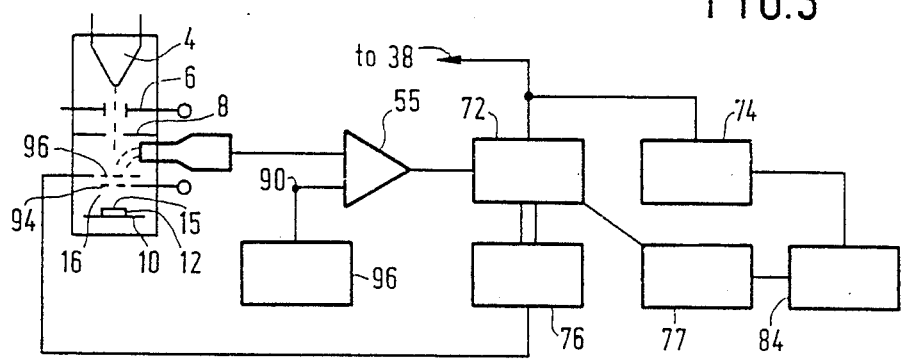
FIG. 4 shows a block diagram of a spectometric version of the detection device.

FIG. 4 shows a block diagram of an arrangement for spectroscopic measurements. Corresponding elements are again denoted by corresponding references. For the measurement of absolute voltages, two additional grids are arranged between the detector 20 and the measuring point 15. A first grid 94 is arranged, for example, approximately 1 mm above the measuring plane. This is a so-called extraction grid which carries a potential of, for example, 600 V. A second grid 96 acts as a delay grid. Only electrons starting from a potential which is lower than the grid potential can pass the grid. The secondary electrons to be measured exhibit an energy distribution with a width of a few eV; for photoelectrons it amounts to at the most 1 eV. As a result, the response curve for notably secondary electrons is S-shaped instead of stepped for electrons having a very narrow energy distribution. The grid voltage of the delay grid 96 can be adjusted, for example, so that 50% of the maximum signal is measured. As the potential of the measuring point 15 on, for example, a track on a chip decreases, the signal increases. Readjustment to 50% of the signal can then take place by decreasing the voltage of the delay grid. This feedback is preferably electronically realized. The degree of grid voltage adaptation required provides the potential decrease or increase of the measuring point. In this embodiment the output voltage of the DAC 76 controls the potential of the delay grid. An output signal of the photomultiplier is compared with a fixed reference voltage of a voltage generator 98. The reference voltage amounts to, for example, 50% of the maximum signal. Multi-sampling can again be used by means of a memory 77 and the trigger frequency need not be constant either.

It should be noted that it is also possible to execute spectroscopic measurements in an apparatus incorporating an individual electron counting system, so that absolute potential measurements can be performed. To this end, traces are included for a set of grid voltage. A computer 84 determines, via interpolation, the grid voltage where the detected number of electrons amounts to 50% of the maximum number to be detected and plots the associated voltage values as a function of a delay time.

The measuring time can be reduced by measuring the signal in the chip with a single mean delay grid potential and by determining S-curves only for maximum and minimum signal values, and the absolute potential via the 50% point. This offers adequate information for many applications. In the majority of cases it is irrelevant how a potential changes between two extreme values.

What is claimed is:

1. A beam inspection apparatus comprising:
an electron beam radiation source,
a measuring space for positioning an object to be examined via an electron beam from said radiation source, said object being an integrated semiconductor circuit chip arranged in the measuring space so as to receive the electron beam,
a beam control system for said electron beam,
a detection device arranged to detect electrons emerging from the object due to interaction between the beam and the object, said detection device comprising electronic devices for counting individual electrons, and
an exposure beam interruptor for pulsed measurements.

2. A beam inspection apparatus as claimed in claim 1 further comprising means for energy-dependent measurement of electrons emanating from the object.

3. A beam inspection apparatus as claimed in claim 1 which is for multi-sample measurements via a series of exposure pulses and a beam interruptor.

4. A beam inspection apparatus as claimed in claim 3, wherein the detection device comprises a fast memory for the temporary storage of measuring signals.

5. A beam inspection apparatus as claimed in claim 1 further comprising an integrating RC circuit and a DAC for analog electron detection.

6. A beam inspection apparatus as claimed in claim 1, further comprising an adjustable reference voltage applied to an operational amplifier, which amplifier is coupled to a DAC via a counter, the potential of a delay grid in the beam control system being controllable by means of a detection signal supplied thereto via the DAC.

7. A beam inspection apparatus as claimed in claim 5 wherein an output of the DAC (digital-to-analog converter) is connected to a delay grid electrode in the beam control system of the apparatus.

8. A beam inspection apparatus as claimed in claim 1 wherein for the individual counting of intercepted electrons, the detection device includes a difference detector having an input coupled to a given threshold voltage, and a counter coupled to said difference detector so that detection signals which exceed the given threshold voltage are counted in said counter.

9. A beam inspection apparatus as claimed in claim 8, wherein the counter is connected to a gate circuit for selection of relevant measuring periods, and means coupling the gate circuit to the beam interruptor.

10. A beam inspection apparatus as claimed in claim 8 further comprising means for energy-dependent measurement of electrons emanating from the object.

11. A beam inspection apparatus as claimed in claim 2 wherein for the individual counting of electrons intercepted by the detection device a given threshold voltage is applied to a difference detector, detection signals exceeding the threshold being counted in a counter.

12. An inspection apparatus comprising:
means for generating a radiation beam,
a beam control system aligned with the path of said radiation beam,
a measuring space for receiving the radiation beam and adapted to hold an object to be inspected,
a detection device for detecting individual electrons emerging from the object due to interaction between the radiation beam and the object, wherein the detection device comprises electronic digital-type counting devices and an output, and wherein said beam control system includes means for directing the radiation beam on to said object independently of the output of the detection device.

13. An inspection apparatus as claimed in claim 12 wherein said detection device further comprises:
a differential amplifier having a first input for receiving a signal determined by the detected electrons received by the detection device,
a digital counting means coupled to an output of the differential amplifier,
a digital/analog converter (DAC) coupled to said counting means and having an output coupled to a second input of the differential amplifier,
a digital memory device coupled to said counting means, and
a control apparatus coupled to at least said memory device and said counting means.

14. An inspection apparatus as claimed in claim 13 wherein said beam control system includes a beam interruptor arranged along the path of said radiation beam, said apparatus further comprising:
a puls generator having an output coupled to said beam interruptor,
a gating device having an output coupled to said counting means, and
delay means coupled between an output of the pulse generator and an input of the gating device.

15. An inspection apparatus as claimed in claim 12 wherein said detection device further comprises:
a differential amplifier having a first input for receiving a signal determined by the electrons received by the detection device,
a digital counting means coupled to an output of the differential amplifier,
a digital/analog converter (DAC) coupled to said counting means and having an output coupled to a delay grid of said beam control system,
a source of reference voltage coupled to a second input of the differential amplifier,
a digital memory device coupled to said counting means, and
a control apparatus coupled to at least said memory device and said counting means.

* * * * *